United States Patent [19]

Egami

[11] Patent Number: 4,596,984
[45] Date of Patent: Jun. 24, 1986

[54] DIGITAL DATA INPUT CIRCUIT

[75] Inventor: Noritaka Egami, Nagasaki, Japan

[73] Assignee: Mitsubishi Denki Kabushiki Kaisha, Tokyo, Japan

[21] Appl. No.: 532,971

[22] Filed: Sep. 16, 1983

[30] Foreign Application Priority Data

Sep. 17, 1982 [JP] Japan .................. 57-162604

[51] Int. Cl.⁴ .................. H01H 35/00; H04Q 1/00
[52] U.S. Cl. .................. 340/825.54; 307/117; 340/825.82
[58] Field of Search .............. 307/117, 269, 463, 465; 340/825.79, 365 S, 825.8, 825.82, 825.89, 825.9, 825.94, 365 R, 365 P, 825.54; 361/416; 328/62, 72, 103, 140

[56] References Cited

U.S. PATENT DOCUMENTS 3,818,451 6/1974 Coleman .................. 340/825.82
4,234,872 11/1980 Halder .................. 340/365 R
4,310,754 6/1982 Check .................. 340/825.57 X
4,320,388 3/1982 McCarthy et al. .................. 307/117 X

FOREIGN PATENT DOCUMENTS 56-57127 5/1981 Japan .

Primary Examiner—Ulysses Weldon
Attorney, Agent, or Firm—Bernard, Rothwell & Brown

[57] ABSTRACT

In a digital data input circuit, a number of switches arranged in matrix of m rows by n columns (m, n: integer being equal to one or more) are operated in ON-/OFF state and signals are obtained to represent setting state of the switches, amplifying means which are additionally connected before and after the switches are driven directly by power including ripple voltage generated by rectifying AC power, and pulse train signal for strobing output signal of the amplifier is generated from the power including the ripple voltage.

3 Claims, 4 Drawing Figures

DIGITAL DATA INPUT CIRCUIT

FIELD OF THE INVENTION

This invention relates to digital data input circuits, and more particularly to an input circuit of a number of data bits driven by AC power source.

Some digital data input circuits use a photocoupler. Such photocoupler usually includes a light-emitting diode for receiving data, and a phototransistor for receiving light from the light-emitting diode and converting it again into electric signal. Furthermore, an amplifier is provided to amplify output of the phototransistor, and such elements of the photocoupler are usually driven by DC power supplied from DC power source.

FIG. 1 shows a circuit diagram of such digital input circuit in prior art. Key switches $1(a)$-$1(l)$ are arranged in matrix of eight rows by four columns as a whole, and scanning signals $W_0$-$W_3$ to discriminate ON/OFF state of the switches are externally entered. The signals $W_0$-$W_3$ are pulse signals each activated only during one pulse period and phase shifted from each other. The signals $W_0$-$W_3$ are applied to cathode of light-emitting diodes $3(a)$-$3(d)$ in photocouplers $2(a)$-$2(d)$, and voltage of $+5$ V is applied to anode of the light-emitting diodes. Therefore, the light-emitting diodes $3(a)$-$3(d)$ perform the light emission at low level of the signals $W_0$-$W_3$, and are connected in optical coupling with phototransistors $5(a)$-$5(d)$ respectively. Outputs of the phototransistors $5(a)$-$5(d)$ are connected to electrical amplifiers $6(a)$-$6(d)$, which supply signals $X_0$-$X_3$ corresponding to $W_0$-$W_3$ into one end of the switches $1(a)$, $1(e)$, $1(i)$; $1(b)$, $1(f)$, $1(j)$; $1(c)$, $1(g)$, $1(k)$; and $1(d)$, $1(h)$, $1(l)$. Other ends of the switches $1(a)$-$1(d)$; $1(e)$-$1(h)$; and $1(i)$-$1(l)$ are commonly connected through diodes $7(a)$-$7(d)$; $7(e)$-$7(h)$; and $7(i)$-$7(l)$ to resistors $8(a)$, $8(b)$, and $8(c)$ respectively.

Photodiodes $3(e)$, $3(f)$, and $3(g)$ of photocouplers $2(e)$, $2(f)$, and $2(g)$ are connected between other ends of the resistors $8(a)$, $8(b)$, and $8(c)$ and DC power source line 9. Phototransistors $5(e)$, $5(f)$, and $5(g)$ of the photocouplers $2(e)$, $2(f)$, and $2(g)$ are optically connected with the photodiodes $3(e)$, $3(f)$, and $3(g)$, and voltage of $+5$ V is applied to collector of the phototransistors $5(e)$, $5(f)$, and $5(g)$ through resistors $4(e)$, $4(f)$, and $4(g)$, thereby sense signals $D_0$-$D_7$ are output from the collector.

A line 9 is connected to a battery 10, and a resistor 11 and a Zener diode 12 are connected in series between the line 9 and the ground. Voltage at the junction of the resistor 11 and the Zener diode 12 is applied to collector of the phototransistors $5(a)$-$5(d)$.

Referring now to FIG. 2 which shows a timing chart of signals $W_0$-$W_3$, when the switch $1(a)$ is closed the signal $W_0$ is transmitted only during its low level through the photocoupler $2(a)$, the amplifier $6(a)$, the switch $1(a)$, the diode $7(a)$, the resistor $8(a)$ and the photocoupler $2(e)$, thereby signal $D_0$ becomes low (significant). In other periods, i.e. when signals $W_1$-$W_3$ become low, none of signals $D_0$-$D_7$ become low and thus the closed state of the switch $1(a)$ is discriminated.

As the number of switches increases in such arrangement, DC power source i.e. the battery 10 must disadvantageously supply more electric power thereto although economical constitution is most required.

An object of this invention is to provide a digital data input circuit which has a simplified power source.

Another object of this invention is to provide a digital data input circuit in which pulse train signal is synchronized with AC source voltage for strobing the output signal.

SUMMARY OF THE INVENTION

These objects are accomplished by the present invention which comprises a digital data input circuit arranged in matrix of m rows by n columns (m, n: integer being equal to one or more) for obtaining signals to represent the setting state of a number of switches operated in ON/OFF state, wherein amplifying means which are additionally connected before and after the switches are driven directly by a power source including ripple obtained by rectifying AC power, and a transfer control signal in synchronization with the ripple is generated.

DETAILED DESCRIPTION OF THE INVENTION

Figure 1:
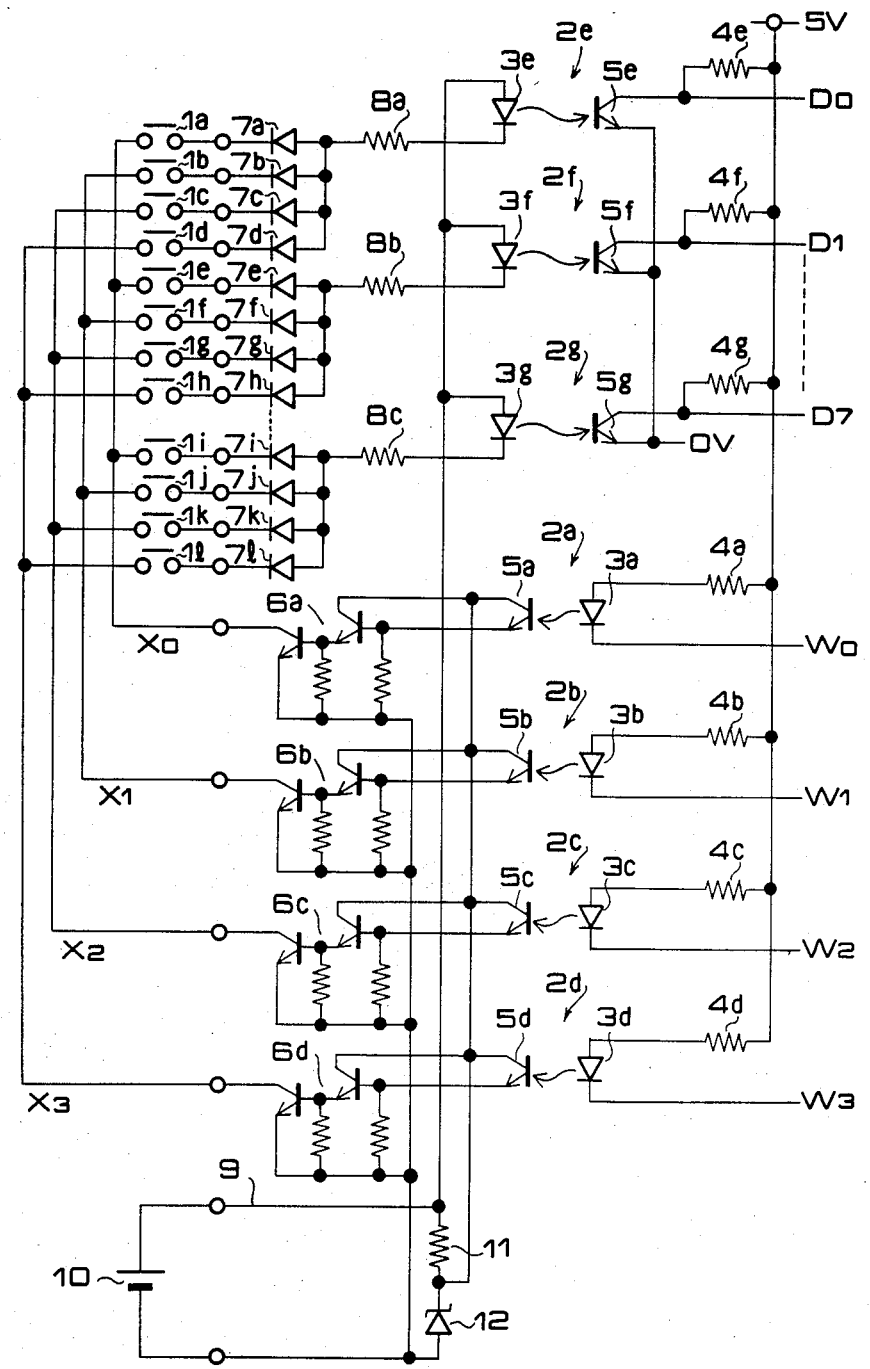
FIG. 1 is a circuit diagram of a digital data input circuit in prior art.
Figure 2:
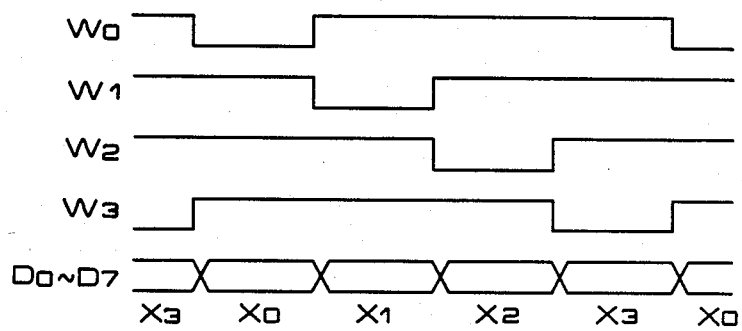
FIG. 2 is a timing chart of operation of the input circuit shown in FIG. 1.
Figure 3:
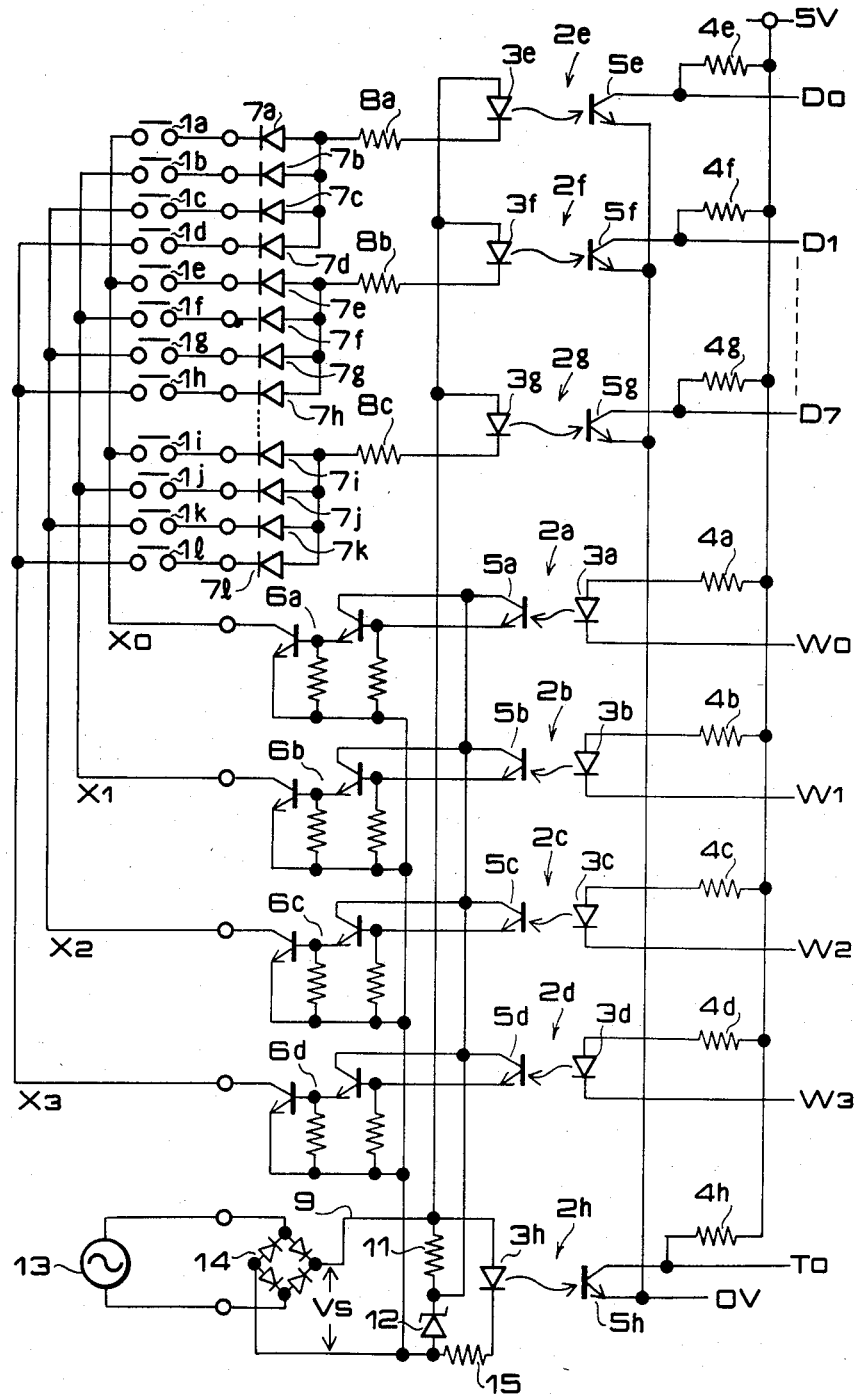
FIG. 3 is a circuit diagram of a data input circuit as an embodiment of the invention.

FIG. 3 shows a digital data input circuit as an embodiment of the invention, in which like reference characters denote like parts in FIG. 1. Power from an external AC power source 13 is supplied to a full-wave rectifier 14 with diodes of bridge connection, and rectified there in full-wave rectification. Output of the rectifier 14 is applied to the photodiodes $3(e)$, $3(f)$, $3(g)$ and $3(h)$ of the photocouplers $2(e)$, $2(f)$, $2(g)$ and $2(h)$. Output voltage of the rectifier 14 is divided by a resistor 11 and a Zener diode 12, and this divided voltage is applied to collector of the phototransistors $5(a)$-$5(d)$ in the photocouplers $2(a)$-$2(d)$ and to the collector of the amplifiers $6(a)$-$6(d)$. The voltage from the rectifier 14 is further supplied across the photodiode $3(h)$ of the photocoupler $2(h)$ through a resistor 15. The photodiode $3(h)$ is optically connected with the phototransistor $5(h)$, and pulse train signal $T_0$ in synchronization with frequency of the AC power source 13 is obtained from collector of the phototransistor $5(h)$.

Figure 4:
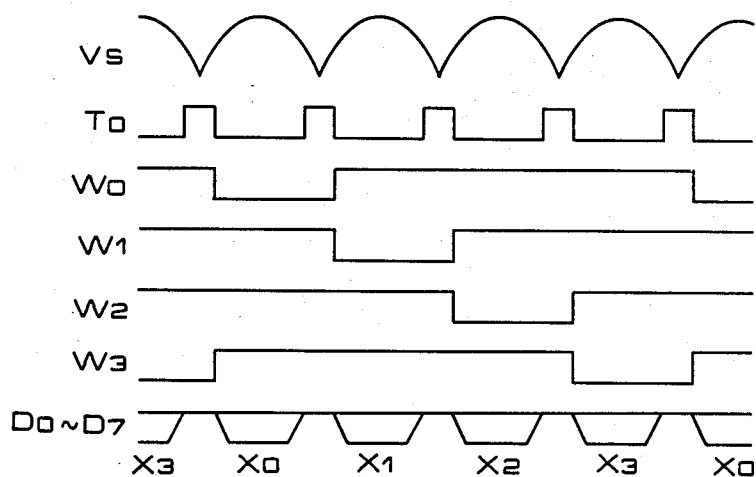
FIG. 4 is a timing chart of operation of the input circuit shown in FIG. 3.

FIG. 4 is a timing chart of operation of the data input circuit shown in FIG. 3. Since voltage $V_s$ of the rectifier 14 has waveform of full-wave rectification of sinusoidal wave as shown in the chart, the photodiode $3(h)$ provides light emission intermittently according to the waveform of the voltage $V_s$. During bottom of the waveform of full-wave rectification, the light emitting diode $3(h)$ does not provide light emission and hence the phototransistor $5(h)$ is not turned on so that output signal $T_0$ from collector of the phototransistor $5(h)$ becomes high. Since the signal $T_0$ becomes low during other periods, pulse train signals in synchronization with the waveform of full-wave rectification are produced, which may be used as strobe signal for the data signals $D_0$-$D_7$.

Although the description has been made in switches of the number $8 \times 4$, the invention should not be limited to the present description of the embodiment, but switches of any number may be used. Furthermore, it is clear by those skilled in the art that the photocoupler may be substituted by a usual transistor of electrical coupling.

What is claimed is:

1. Digital data input circuit, wherein a number of switches arranged in matrix of m rows by an columns (m, n: integer being equal to one or more) are operated in ON/Off state, signals are supplied sequentially through first amplifying means to the corresponding switches of each of said n columns during phase periods different from each other, said signals being taken out of the switches of m rows through second amplifying means; said input circuit comprising rectifying means for rectifying AC power in full-wave rectification and supplying the rectified power as an output voltage to the first and second amplifying means, and signal generating means for converting the waveform of said output voltage of the rectifying means and generating a pulse train in synchronization with the frequency of the AC power source for enabling output signals of the second amplifying means.

2. Digital data input circuit as set forth in claim 1, characterized in that said rectifying means is a full-wave rectifier composed of diodes in bridge connection.

3. Digital data input circuit as set forth in claim 1, characterized in that said signal generating means comprises a photocoupler including a light-emitting diode for receiving output voltage of the rectifying means and a phototransistor connected optically with the light-emitting diode for generating the pulse train from collector thereof.

* * * * *